United States Patent
Iwasaki

(10) Patent No.: US 6,274,427 B1
(45) Date of Patent: Aug. 14, 2001

(54) METHOD OF MANUFACTURING A DRAM CAPACITOR

(75) Inventor: Haruo Iwasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/551,198

(22) Filed: Apr. 17, 2000

(30) Foreign Application Priority Data

Apr. 19, 1999 (JP) ................................. 11-110981

(51) Int. Cl.[7] ............................................. H01L 21/8242
(52) U.S. Cl. .................... 438/253; 438/254; 438/396; 438/397
(58) Field of Search ........................ 257/303, 304, 257/306, 308, 309; 438/253, 254, 396, 397, 398

(56) References Cited

U.S. PATENT DOCUMENTS

| | | | |
|---|---|---|---|
| 5,543,346 | * 8/1996 | Keum et al. | 438/397 |
| 5,796,649 | * 8/1998 | Keum et al. | 365/149 |
| 5,909,045 | * 6/1999 | Chao | 257/308 |
| 5,998,260 | * 12/1999 | Lin | 438/253 |
| 6,100,135 | * 8/2000 | Wu | 438/253 |
| 6,127,219 | * 10/2000 | Chao | 438/253 |
| 6,153,464 | * 11/2000 | Chao | 438/254 |

FOREIGN PATENT DOCUMENTS 9-275194    10/1997   (JP).

* cited by examiner

Primary Examiner—Olik Chaudhuri
Assistant Examiner—Hoai Pham
(74) Attorney, Agent, or Firm—Young & Thompson

(57) ABSTRACT

A capacitor is provided, which makes it easy to increase the opposing area size between the lower and upper electrode in spite of miniaturization, and which ensures a desired capacitance value large enough for stable operation of a semiconductor memory device in spite of miniaturization. The capacitor is comprised of a lower electrode formed over an interlayer dielectric layer of a substrate, an upper electrode, and a dielectric located between the lower and upper electrodes. The lower electrode has a first electrode part and a second electrode part connected to each other. The first electrode part includes a plate-shaped bottom subpart and a sidewall subpart extending upward from the periphery of the bottom subpart. The bottom subpart and the sidewall subpart form an inner space. At least part of the second electrode part is located in the inner space so that a first gap is formed between the bottom subpart and the second electrode part and a second gap is formed between the sidewall subpart and the second electrode part. The upper electrode is opposed to the bottom subpart of the first electrode part of the lower electrode and to the second electrode part thereof in the first gap, and is opposed to the sidewall subpart of the first electrode part of the lower electrode and to the second electrode part thereof in the second gap.

12 Claims, 11 Drawing Sheets

METHOD OF MANUFACTURING A DRAM CAPACITOR

BACKGROUND OF THE INVENTION

1. Field of the Invention

The present invention relates to a semiconductor device and more particularly, to a capacitor structure of a semiconductor device applicable to a storage capacitor of a semiconductor memory device, and a method of fabricating the same.

2. Description of the Prior Art

Storage capacitors are one of the main components of the memory cell of a semiconductor memory device.

In general, the output voltage from the memory cell is proportional to the capacitance value of the storage capacitor of the cell and thereof, the capacitor need to have a satisfactorily large capacitance value to ensure stable operation of the cell or to improve the operation reliability of the cell. On the other hand, the capacitor needs to be further miniaturized with the recent progressing miniaturization and integration of the cell. Thus, in recent years, there has been the strong need to develop new capacitor structures that make it possible to realize a satisfactorily large capacitance value even if the cell is further miniaturized. To meet this need, various capacitor structures have been developed and disclosed, one of which is shown in FIG. 1.

FIG. 1 shows a part of the memory cells of a semiconductor memory device, in which prior-art storage capacitors 130 are formed on the surface of a semiconductor substrate 101 along with Metal-Oxide-Semiconductor Field-Effect Transistors (MOSFETs) 131. One of the MOSFETs 131 and a corresponding one of the capacitors 130 constitute the cell.

An isolation dielectric 102 is selectively formed on the surface of the substrate 101, defining active areas (not shown) thereon. In each of the active areas, a gate insulator 120 is selectively formed on the surface of the substrate 101, a gate electrode 103 is formed on the gate insulator 120, and a pair of source/drain regions 121a and 121b are formed in the substrate 101 at each side of the gate electrode 103. The pair of source/drain regions 121a and 121b, the gate insulator 120, and the gate electrode 103 constitute the MOSFET 131 in each of the active areas.

A first interlayer dielectric layer 104 is formed to cover the isolation dielectric 102, the gate electrodes 103, and the pairs of exposed source/drain regions 121a and 121b. A second interlayer dielectric layer 105 is formed on the first interlayer dielectric layer 104. The layer 105 is thicker than the first interlayer dielectric layer 104, because a wiring layer 106 is formed in the layer 105. The wiring layer 106 is electrically connected to the respective source/drain regions 121a. The wiring layer 106 does not appear in the cross-section of the device shown on FIG. 1 and thus, it is illustrated by broken lines.

A silicon nitride ($SiN_x$) layer 107 is formed on the second interlayer dielectric layer 105. The layer 107 serves as an etch stop layer in the process of etching the layers overlying the layer 107.

Contact holes 122 are formed to penetrate the $SiN_x$ layer 107 and the second and first interlayer dielectric layers 105 and 104. The holes 122 reach the corresponding source/drain regions 121b, exposing the same. The holes 122 are filled with conductive contact plugs 117. The bottoms of the plugs 117 are contacted with and electrically connected to the corresponding source/drain regions 121b.

Lower electrodes 116, which serve a charge storage electrodes of the respective memory cells, are formed on the $SiN_x$ layer 107 to be overlapped with the respective active areas. These electrodes 116 are separated from each other by small gaps. As seen from FIG. 1, each of the electrodes 116 is formed by a circular-plate-shaped bottom. 116a and a cylindrical sidewall 116b connected to the periphery of the bottom 116a. The sidewall 116b extend upward from the periphery of the bottom 116a. The center of the bottom 116a is contacted with and electrically connected to the top of a corresponding one of the contact plugs 117.

A capacitor dielectric 114 is formed to cover all the lower electrodes 116. The dielectric 114 is contacted with not only the exposed areas of the electrodes 116 but also those of the silicon nitride layer 107 exposed from the gaps between the electrodes 116. The dielectric 114 is commonly used for all the electrodes 116.

An upper electrode 115 is formed on the capacitor dielectric 114 to be opposite to all the lower electrodes 116. The electrode 115 is commonly used for all the electrodes 116. The electrode 115 extends along the dielectric 114.

The upper electrode 115, the capacitor dielectric 114, and one of the lower electrodes 116 constitute each of the storage capacitors 130. Each of the MOSFETs 131 and a corresponding one of the capacitors 130 constitute the memory cell.

Next, a method of fabricating the prior-art semiconductor memory device shown in FIG. 1 is explained below with reference to FIGS. 2A to 2H.

First, as shown in FIG. 2A, the isolation dielectric 102, which is made of silicon dioxide ($SiO_2$), is selectively formed on the surface of the semiconductor substrate 101, thereby defining the active areas. Next, a $SiO_2$ layer (not shown) is formed on the whole surface of the substrate 101 and an impurity-doped polysilicon layer (not shown) is deposited on the $SiO_2$ layer thus formed. The $SiO_2$ and polysilicon layers are patterned to have a specific shape, thereby forming the gate insulators 120 and the gate electrodes 103 on the surface of the substrate 101 in the respective active areas.

Using the isolation dielectric 102 and the gate electrodes 102 as a mask, an impurity is selectively implanted into the substrate 101, thereby forming the pairs of the source/drain regions 121a and 121b in the respective active areas. Each pair of source/drain regions 121a and 121b is located in self-alignment with respect to a corresponding one of the gate electrodes 103.

Thus, the MOSFETs 131 are fabricated on the substrate 101, each which is formed by one of the pairs of source/drain regions 121a and 121b, a corresponding one of the gate insulators 120, and a corresponding one of the gate electrodes 103.

Subsequently, the first interlayer dielectric layer 104, which is made of $SiO_2$, is formed to cover the whole surface of the substrate 101. At this time, the isolation dielectric 102 and the MOSFETs 131 are covered with the layer 104, Then, the second interlayer dielectric layer 105, which is made of BoroPhospoSilicate Glass (BPSG), is formed on the first interlayer dielectric layer 104. The layer 105 contains in its inside the wiring layer 106 electrically connected to the respective source/drain regions 121a. The $SiN_x$ layer 107 is formed on the second interlayer dielectric layer 105 thus formed by a Chemical Vapor Deposition (CVD) method.

On the $SiN_x$ layer 107 thus formed, a patterned resist film 109 having openings 109a is formed. The openings 109a are used for forming the contact holes 122 and located at positions right over the respective source/drain regions 121b. The state at this stage is shown in FIG. 2A.

Following this step, using the patterned resist film 109 as a mask, the SiN$_x$ layer 107 and the second and first interlayer dielectric layers 105 and 104 are etched selectively and successively. Thus, as shown in FIG. 2B, the contact holes 122 are formed to penetrate the layers 107, 105, and 104, exposing the underlying source/drain regions 121b. Thereafter, the resist film 109 is removed.

A first conductive layer (not shown) having a thickness large enough for filling the contact holes 122 is formed on the SiN$_x$ layer 107. As the first conductive layer, for example, an impurity-doped (i.e., n- or p-type) polysilicon layer is used. The first conductive layer thus formed is then etched back until the underlying SiN$_x$ layer 107 is exposed, thereby leaving selectively the first conductive layer in the holes 122. Thus, as shown in FIG. 2C, the conductive contact plugs 117 are formed in the holes 122 by the remaining first conductive layer.

Subsequently, as shown in FIG. 2D, the first interlayer dielectric layer 108, which is made of SiO$_2$, is formed on the SiN$_x$ layer 107. The layer 108 is contacted with the tops of the plugs 117. On the layer 108 thus formed, a patterned resist film 112 is then formed. The film 112 has openings 112a that expose selectively the areas where the lower electrodes 116 are to be formed. Using the film 112 as a mask, the first interlayer dielectric layer 108 is selectively etched to form a spacer layer 108a on the layer 107, as shown in FIG. 2E. The spacer layer 108a has openings 128 that expose the underlying SiN$_x$ layer 107 and the tops of the contact plugs 117, which is used for defining the lower electrodes 116.

Next, as shown in FIG. 2F, a second conductive layer 113, which is made of an impurity-doped (i.e., n- or p-type) polysilicon, is formed on the SiN$_x$ layer 107 to cover the spacer layer 108a and the exposed contact plugs 117. Then, a second dielectric layer 111, which is made of SiO$_2$, is deposited on the layer 113 by a CVD method. The layer 111 has a thickness large enough for burying entirely the openings 128 of the layer 108a.

Thereafter, the second dielectric layer 111 and the second conductive layer 113 are successively etched back until the top of the spacer layer 108a is exposed. Thus, as shown in FIG. 2G, the parts of the layer 113 existing outside the openings 128 are selectively removed, leaving the layer 113 only in the opening 128. As a result, the lower electrodes 116 are formed on the SiN$_x$ layer 107 by the remaining parts of the layer 113.

To completely remove the spacer layer 108a and the remaining second dielectric layer 111, these layers 108a and 111 are further etched while the SiN$_x$ layer 108 is used as an etch stop layer. The state at this stage is shown in FIG. 2H.

Following this, as shown in FIG. 1, the capacitor dielectric 114, which has a layered structure of SiO$_2$ and SiN$_x$ layers, is formed to cover the lower electrode 116. The dielectric 114 is contacted with the exposed areas of the SiN$_x$ layer 107 through the gaps between the electrodes 116.

Finally, as shown in FIG. 1, the upper electrode 115, which is made of an impurity-doped polysilicon, is formed on the capacitor dielectric 114. The electrode 115 extends along the dielectric 114. Thus, the prior-art semiconductor memory device with the storage capacitors 130 is fabricated.

As explained above, with the prior-art storage capacitor 131 shown in FIG. 1, the opposing area between the lower and upper electrodes 116 and 115 can be increased due to existence of the cylindrical sidewall 116b of the lower electrode 116, raising its capacitance value. However, a desired capacitance value that copes with further miniaturization and integration of the storage cell is unable to be accomplished.

Additionally, another prior-art structure of the storage capacitor is disclosed in the Japanese Non-Examined Patent Publication No. 9-275194 published in October 1997. In this structure, the lower electrode has a "double cylindrical structure" that the lower electrode has concentric inner and outer cylindrical parts and therefore, an obtainable capacitance value is larger than that of the prior-art capacitor structure shown in FIG. 1. Even in this structure, however, a desired capacitance value coping with further miniaturization and integration of the storage cells is unable to be accomplished.

In summary, with the above-explained prior-art capacitor structures, any satisfactory amount of electric charge becomes unable to be stored in the storage capacitor due to their unsatisfactory capacitance value according to the progressing miniaturization. As a result, there is a problem that stable operation of the memory cells cannot be ensured and consequently, the operation reliability of the semiconductor memory device degrades.

SUMMARY OF THE INVENTION

Accordingly, an object of the present invention is to provide a capacitor that makes it easy to increase the opposing area size between the lower and upper electrodes in spite of miniaturization, and a method of fabricating the capacitor.

Another object of the present invention is to provide a capacitor that ensures a desired capacitance value large enough for stable operation of a semiconductor memory device in spite of miniaturization, and a method of fabricating the capacitor.

The above objects together with others not specifically mentioned will become clear to those skilled in the art from the following description.

According to a first aspect of the present invention, a capacitor is provided, which is comprised of:

(a) a substrate having an interlayer dielectric layer;

(b) a lower electrode formed over the interlayer dielectric layer;

the lower electrode having a first electrode part and a second electrode part connected to each other;

the first electrode part including a bottom subpart and a sidewall subpart extending upward from a periphery of the bottom subpart;

the bottom subpart and the sidewall subpart forming an inner space;

at least part of the second electrode part being located in the inner space so that a first gap is formed between the bottom subpart and the second electrode part and a second gap is formed between the sidewall subpart and the second electrode part;

(c) a capacitor dielectric formed to extend along exposed areas of the bottom subpart and the sidewall subpart of the first electrode part and along an exposed area of the second electrode part in said first and second gaps; and (d) an upper electrode formed on the capacitor dielectric;

the upper electrode being opposed to the bottom subpart of the first electrode part of the lower electrode and to the second electrode part thereof in the first gap;

the upper electrode being opposed to the sidewall subpart of the first electrode part of the lower electrode and to the second electrode part thereof in the second gap.

With the capacitor according to the first aspect of the present invention, the lower electrode has the first electrode part and the second electrode part connected to each other. The first electrode part includes the bottom subpart and the sidewall subpart extending upward from the periphery of the bottom subpart. At least part of the second electrode part is located in the inner space formed by the bottom subpart and the sidewall subpart of the first electrode part, so that the first gap is formed between the bottom subpart of the lower electrode and the second electrode part and at the same time, the second gap is formed between the sidewall subpart of the lower electrode and the second electrode part.

Also, the upper electrode is opposed to the bottom subpart of the first electrode part of the lower electrode and to the second electrode part thereof through the capacitor dielectric in the first gap. Furthermore, the upper electrode is opposed to the sidewall subpart of the first electrode part of the lower electrode and to the second electrode part thereof through the capacitor dielectric in the second gap.

Thus, the opposed area between the upper and lower electrodes can be expanded easily. In other words, the opposing area size between the lower and upper electrodes can be easily increased in spite of miniaturization. This ensures a desired capacitance value large enough for stable operation of a semiconductor memory device.

In a preferred embodiment of the capacitor according to the first aspect of the invention, the bottom subpart of the first electrode part has an opening and the interlayer dielectric layer has an opening. The second electrode part is contacted with and electrically connected to a wiring layer formed between the interlayer dielectric layer and the substrate or a conductive region formed in the substrate through the openings.

In this embodiment, it is preferred that the bottom subpart of the first electrode part is plate-shaped and that the second electrode part includes a plate-shaped main subpart and a contracting subpart extending downward from the main subpart. The main subpart is entirely located in the inner space of the lower electrode. The contacting subpart is contacted with and electrically connected to the wiring layer or the conductive region through the openings.

In another preferred embodiment of the capacitor according to the first aspect of the invention, the second electrode part of the lower electrode includes a main subpart and a contacting subpart extending downward from the main subpart toward the substrate. The contacting subpart penetrates the bottom subpart of the first electrode part to be contacted therewith.

In this embodiment, it is preferred that the contacting subpart of the second electrode part is contacted with and electrically connected to a wiring layer formed between the interlayer dielectric layer and the substrate or a conductive region formed in the substrate through the openings.

In still another preferred embodiment of the capacitor according to the first aspect of the invention, the bottom subpart of the first electrode part is circular-plate-shaped and the sidewall subpart thereof is cylindrical. The main subpart of the second electrode is circular-plate-shaped.

According to a second aspect of the present invention, a method of fabricating a capacitor is provided, which fabricates the capacitor according to the first aspect of the invention. This method is comprised of steps of (a) to (j).

In the step (a), a substrate having an interlayer dielectric layer is prepared.

In the step (b), a first spacer layer is formed over the interlayer dielectric layer. The first spacer layer has an opening penetrating the same.

In the step (c), a first conductive layer is formed on the interlayer dielectric layer to cover the first spacer layer.

In the step (d), a second layer is formed on the first conductive layer.

In the step (e), the second spacer layer, the first conductive layer, and the interlayer dielectric layer are selectively removed, thereby forming a contact hole penetrating the second spacer layer, the first conductive layer, and the interlayer dielectric layer.

In the step (f), a second conductive layer is formed on the second spacer layer. The second conductive layer is contacted with the first conductive layer.

In the step (g), the second and first conductive layers and the second spacer layer are selectively removed until the first spacer layer is exposed, thereby leaving selectively the second and first conductive layers and the second spacer layer in the opening of the first spacer layer.

The first conductive layer left in the opening of the first spacer layer serves as a first electrode part of a lower electrode, where the first electrode part includes a bottom subpart and a sidewall subpart extending upward from a periphery of the bottom subpart. The bottom subpart and the sidewall subpart form an inner space.

The second conductive layer left in the opening of the first spacer layer serves as a second electrode part of the lower electrode. At least part of the second electrode part is located in the inner space so that a first gap is formed between the bottom subpart and the second electrode part and a second gap is formed between the sidewall subpart and the second electrode part.

In the step (h), the second spacer layer left in the opening of the first spacer layer and the first spacer layer are entirely removed.

In the step (i), a capacitor dielectric is formed on exposed areas of the first electrode part of the lower electrode and the second electrode part thereof.

In the step (j), an upper electrode is formed on the capacitor dielectric so as to fill the first and second gaps between the first electrode part of the lower electrode and the second electrode part thereof.

With the method of fabricating a capacitor according to the second aspect of the present invention, the first spacer layer is formed over the interlayer dielectric layer in the step (b), where the first spacer layer has an opening selectively exposing the interlayer dielectric layer. Thee first conductive layer is formed on the interlayer dielectric layer to cover the first spacer layer in the step (c). The second spacer layer is formed on the first conductive layer in the step (d). Thereafter, the second spacer layer, the first conductive layer, and the interlayer dielectric layer are selectively removed, thereby forming the contact hole penetrating the second spacer layer, the first conductive layer, and the interlayer dielectric layer in the step (e).

Also, in the step (f), the second conductive layer is formed on the second spacer layer to be contacted with the first conductive layer. In the step (g), the second and first conductive layers and the second spacer layer are selectively removed until the first spacer layer is exposed, thereby leaving selectively the second and first conductive layers and the second spacer layer in the opening of the first spacer layer.

The first conductive layer left in the opening of the first spacer layer serves as the first electrode part of the lower electrode, where the first electrode part includes a bottom subpart and a sidewall subpart extending upward from a periphery of the bottom subpart. The bottom subpart and the sidewall subpart form an inner space.

The second conductive layer left in the opening of the first spacer layer serves as a second electrode part of the lower electrode. At least part of the second electrode part is located in the inner space so that a first gap is formed between the bottom subpart and the second electrode part and a second gap is formed between the sidewall subpart and the second electrode part.

Moreover, in the step (h), the second spacer layer left in the opening of the first spacer layer and the first spacer layer are entirely removed.

Accordingly, the capacitor according to the first aspect of the present invention can be fabricated. Since no special process is required, this method can be easily carried out, in other words, the capacitor can be fabricated easily.

In a preferred embodiment of the method according to the second aspect of the invention, the second conductive layer left in opening of the first spacer layer, which serves as the second electrode part of the lower electrode, is contacted with and electrically connected to a wiring layer formed between the interlayer dielectric layer and the substrate or a conductive region formed in the substrate through the contact hole.

In another preferred embodiment of the method according to the second aspect of the invention, the bottom subpart of the first electrode part is circular-plate-shaped and the sidewall subpart thereof is cylindrical. The second electrode part is circular-plate-shaped.

In still another preferred embodiment of the method according to second aspect of the invention, the step (g) is carried out by an etch back process.

In a further preferred embodiment of the method according to second aspect of the invention, a step of planarizing a surface of the upper electrode is additionally carried out after the step (j).

In a still further preferred embodiment of the method according to second aspect of the invention, the first and second spacer layers are simultaneously removed by an etching process in the step (h).

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
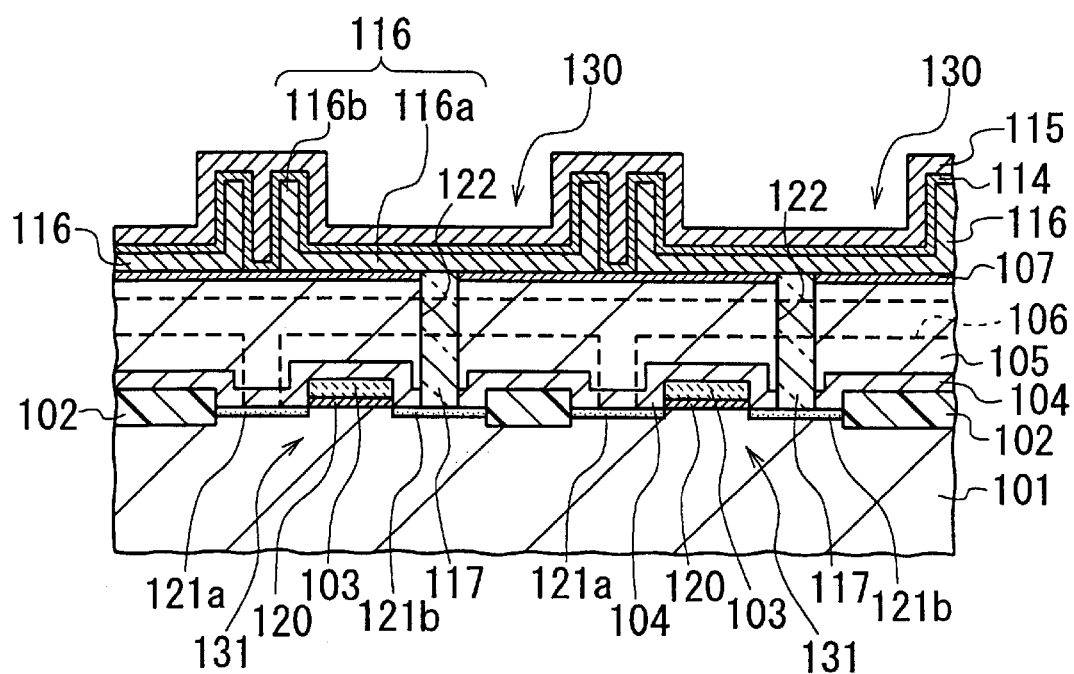
FIG. 1 is a schematic, partial cross-sectional view showing the configuration of a prior-art storage capacitor of a semiconductor memory device.
Figure 2A:
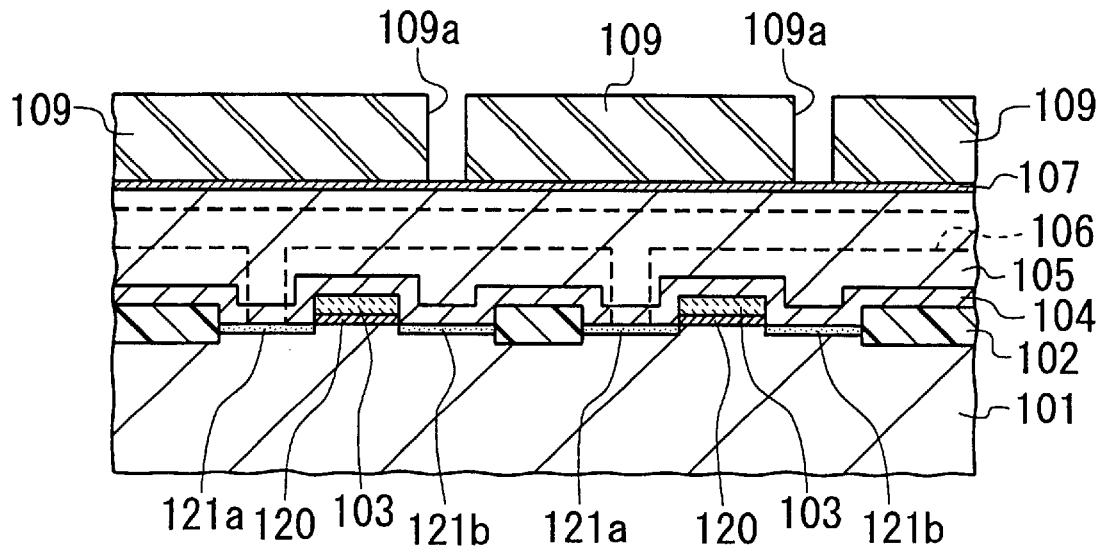
FIGS. 2A to 2H are schematic, partial cross-sectional views showing the process steps of a method of fabricating the prior-art storage capacitor of FIG. 1.
Figure 2B:
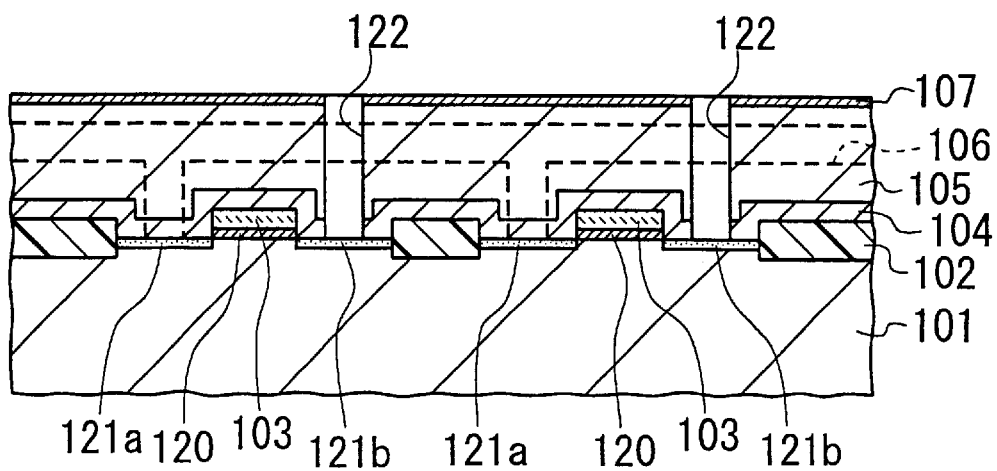
Figure 2C:
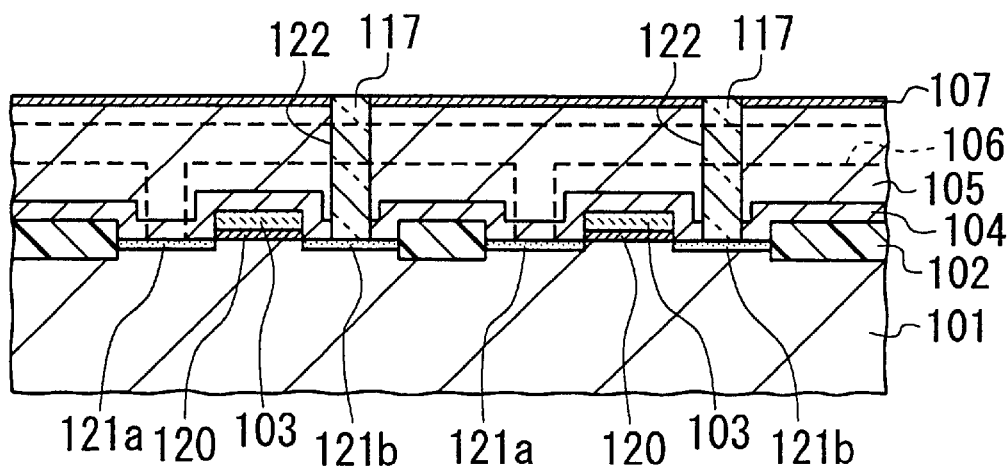
Figure 2D:
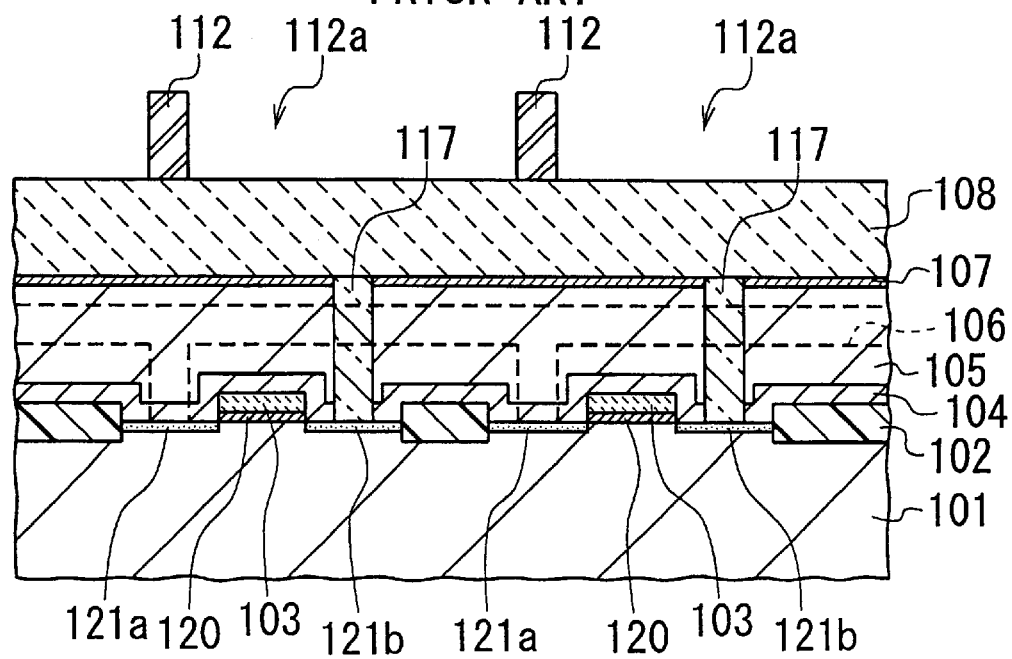
Figure 2E:
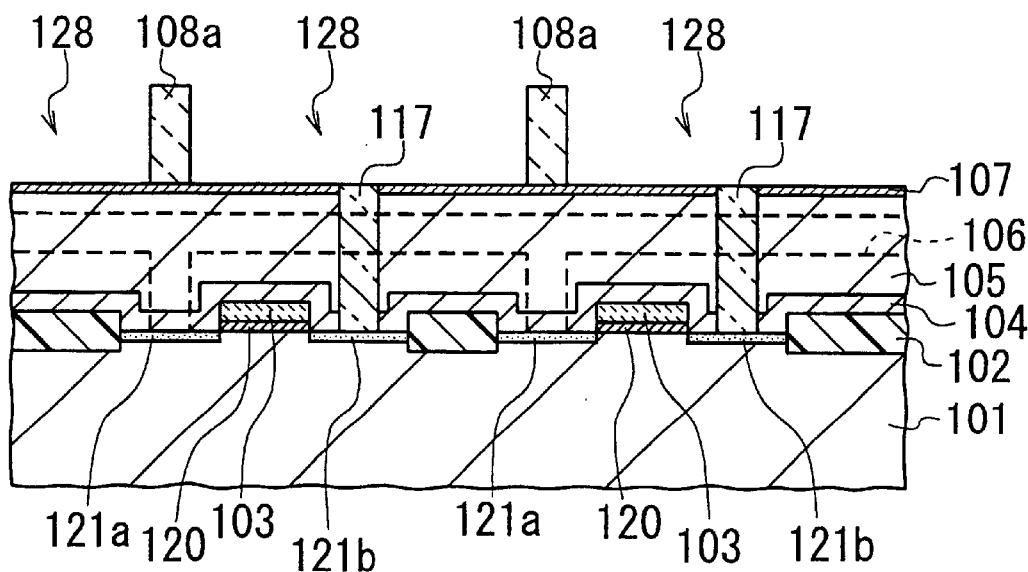
Figure 2F:
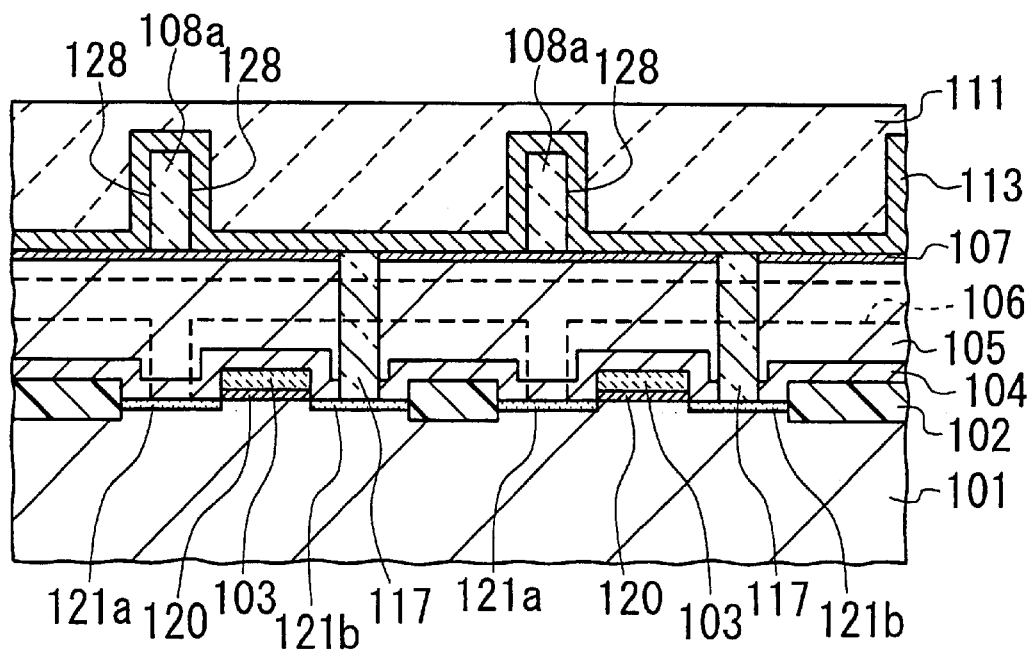
Figure 2G:
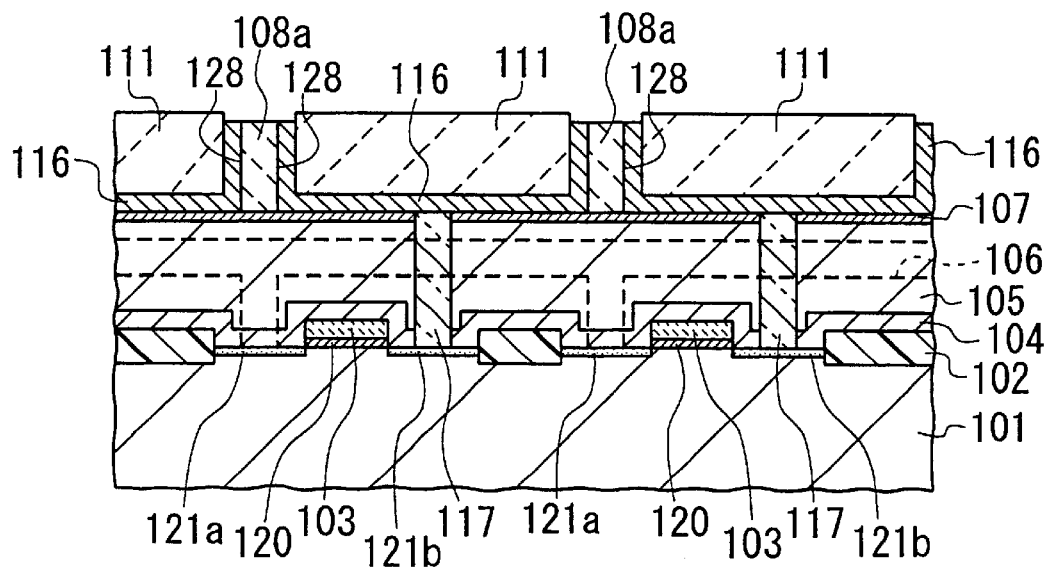
Figure 2H:
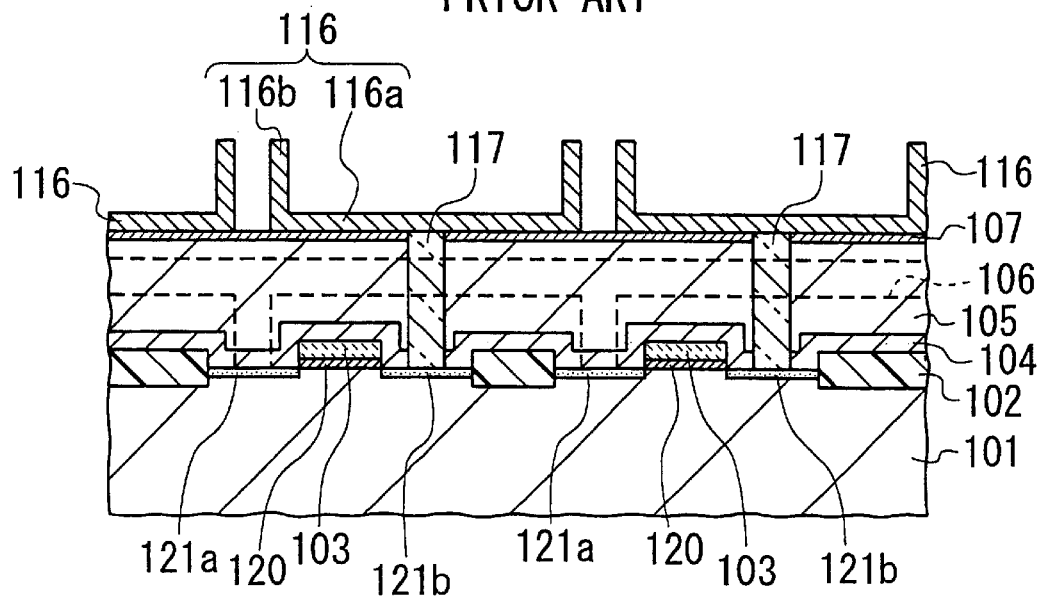

Preferred embodiments of the present invention will be described in detail below while referring to the drawings attached.

Figure 3:
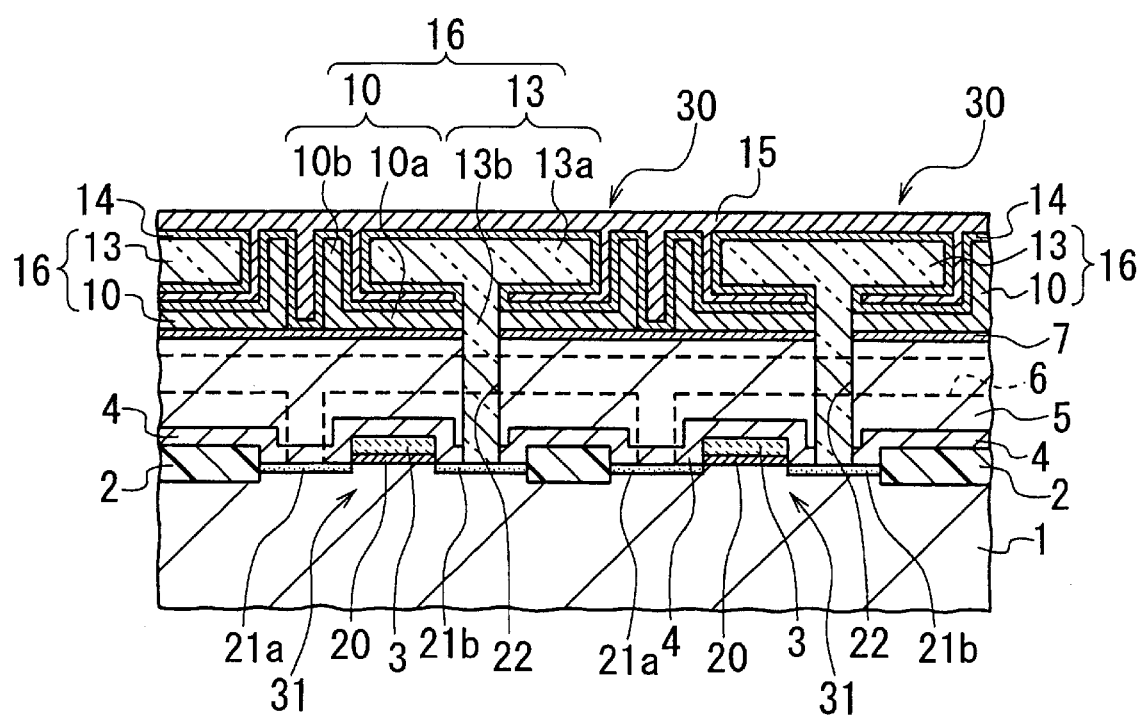
FIG. 3 is a schematic, partial cross-sectional view showing the configuration of a storage capacitor of a semiconductor memory device according to an embodiment of the present invention.

FIG. 3 shows a part of the memory cells of a semiconductor memory device, in which storage capacitors 30 according to an embodiment of the invention are formed on the surface of a semiconductor substrate 1 along with MOSFETs 31. The memory device includes a lot of memory cells arranged regularly on the substrate 1. Here, each of the cells is constituted by one of the MOSFETs 31 and a corresponding one of the capacitors 30.

An isolation dielectric 2 is selectively formed on the surface of the substrate 1, defining active areas (not shown) thereon. In each of the active areas, a gate insulator 20 is selectively formed on the surface of the substrate 1, a gate electrode 3 is formed on the gate insulator 20, and a pair of source/drain regions 21a and 21b are formed in the substrate 1 at each side of the gate electrode 3. The pair of source/drain regions 21a and 21b, the gate insulator 20, and the gate electrode 3 constitute the MOSFETs 31 in each of the active areas. Thus, the MOSFETs 31 are located in the respective active areas.

A first interlayer dielectric layer 4 is formed to cover the isolation dielectric 2, the gate electrodes 3, and the pairs of source/drain regions 21a and 21b. A second interlayer dielectric layer 5 is formed on the first interlayer dielectric layer 4. The layer 5 is thicker than the first interlayer dielectric layer 4, because a wiring layer 6 is formed in the layer 5. The wiring layer 6 is electrically connected to the source/drain regions 21a. The wiring layer 6 does not appear in the cross-section of the device shown in FIG. 3 and thus, it is illustrated by broken lines.

A $SiN_x$ layer 7 is formed on the second interlayer dielectric layer 5. The layer 7 serves as an etch stop layer in the process of etching the layers overlying the layer 7, which is explained later.

Lower electrodes 16, which serve as charge storage electrodes of the respective memory cells, are formed to be arranged regularly on the $SiN_x$ layer 7. Each of the electrodes 16 is formed by a first electrode part 10 and a second electrode part 13.

The first electrode part 10 of the lower electrode 16 has a circular-plate-shaped bottom subpart 10a formed on the $SiN_x$ layer 7, and a cylindrical sidewall subpart 10b extending upward from the periphery of the bottom subpart 10a. These two subparts 10a and 10b form a cylindrical inner space thereon.

The second electrode part 13 has a circular-plate-shaped main support 13a having a smaller diameter than that of the sidewall subpart 10b, and a column-shaped contacting subpart 13b extending downward from the center of the subpart 13a. The whole bottom subpart 13a is located in the inner space defined by the subparts 10a and 10b of the first electrode part 10.

The bottom face of the main subpart 13a is approximately parallel to and is opposed to the top face of the bottom subpart 10a. The outer side face of the main subpart 13a is approximately parallel to and is opposed to the inner side face of the sidewall subpart 10b. The main support 13a is apart from the bottom subpart 10a by a small gap. The main subpart 13a is apart from the sidewall subpart 10b by another small gap.

The contacting subpart 13b is located in a corresponding one of contact holes 22. Each of the holes 22 penetrates the bottom subpart 10a of the first electrode part 10, the $SiN_x$ layer 7, and the second and first interlayer dielectric layers 5 and 4, reaching a corresponding one of the source/drain regions 21b.

The inner end of the bottom subpart 10a is contacted with the outer face of the contacting subpart 13b in the hole 22, thereby electrically connecting the second part 13 to the first part 10. The bottom end of the subpart 13b is contacted with a corresponding one of the source/drain regions 21b, thereby electrically connecting the lower electrode 16 to the corresponding source/drain regions 21b.

A film-shaped capacitor dielectric 14 is formed to extend along the exposed areas of the first and second electrode parts 10 and 13 of the lower electrode 16. The dielectric 14 is contacted not only with the exposed areas of the electrode 16 but also with the exposed areas of the $SiN_x$ layer 7 through the gaps between the adjoining lower electrodes 16. Thus, the exposed areas of the first and second electrode parts 10 and 13 are entirely contacted with one side of the dielectric 14. The dielectric 14 is commonly used for all the lower electrodes 16, i.e., for all the cells.

A common upper electrode 15 having a flat surface is formed on another side of the capacitor dielectric 14. The electrode 15 extends to the gaps between the first and second electrode parts 10 and 13 of all the lower electrodes 16. In other words, the gaps are filled with the dielectric 14 and the electrode 15. The electrode 15 is commonly used for all the lower electrodes 16 or all the cells.

The lower electrode 16, the capacitor dielectric 4, and the upper electrode 15 constitute the storage capacitor 30 of each memory cell.

Next, a method of fabricating the semiconductor memory device with the storage capacitors 30 according to the embodiment of FIG. 3 is explained below with reference to FIGS. 4A to 4H.

Figure 4A:
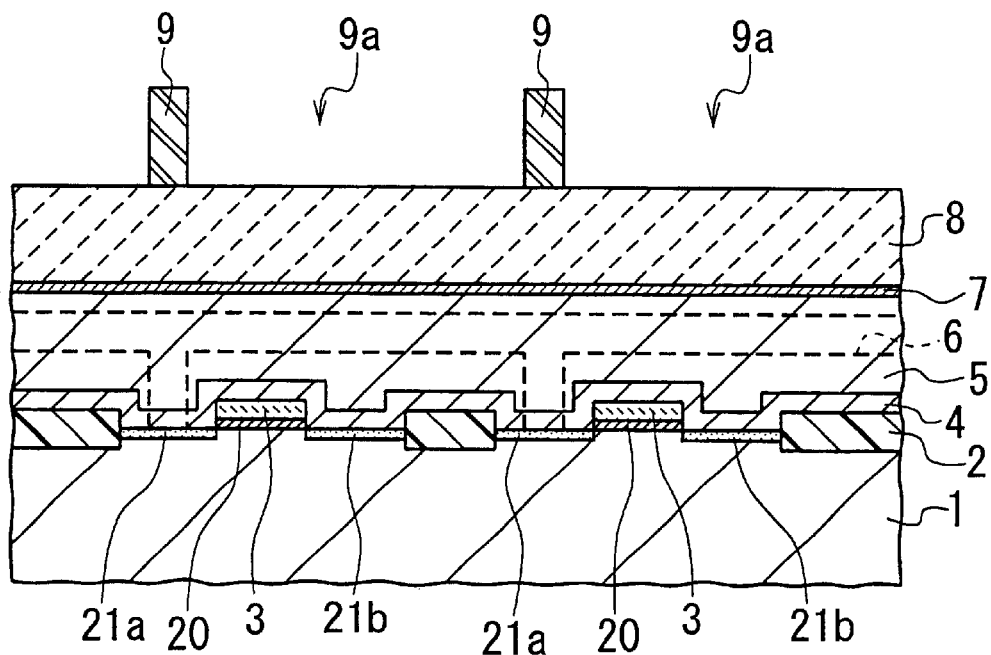
FIGS. 4A to 4H are schematic, partial cross-sectional views showing the process steps of a method of fabricating the storage capacitor of FIG. 3.

First, as shown in FIG. 4A, the isolation dielectric 2, which is made of $SiO_2$, is selectively formed on the surface of the silicon substrate 1, thereby defining the active areas. Next, a $SiO_2$ layer (not shown) is formed on the whole surface of the substrate 1 and an impurity-doped (i.e., n- or p-type) polysilicon layer (not shown) is deposited on the $SiO_2$ layer thus formed. The $SiO_2$ and polysilicon layer are then patterned to have a specific shape, thereby forming the gate insulators 20 and the gate electrodes 3 on the surface of the substrate 1 in the respective active areas.

Using the isolation dielectric 2 and the gate electrodes 3 as a mask, n- or p-type impurity is selectively implanted into the substrate 1, thereby forming the pairs of the source/drain regions 21a and 21b in the respective active areas. The pairs of source/drain regions 21a and 21b are formed in self-alignment with respect to the corresponding gate electrode 3.

Thus, the MOSFETs 31 are formed on the substrate 1, each of which is formed by the pair of source/drain regions 21a and 21b, the gate insulator 20, and the gate electrode 3.

Subsequently, the first interlayer dielectric layer 4, which is made of $SiO_2$, is formed to cover the whole substrate 1. The isolation dielectric 2 and the MOSFETs 31 are covered with the layer 4. The second interlayer dielectric layer 5, which is made of BPSG, is formed on the first interlayer dielectric layer 4. The layer 5 contains the wiring layer 6 electrically connected to the respective source/drain regions 21a in its inside. The wiring layer 6 may be made of tungsten silicide ($WSi_2$).

The $SiN_x$ layer 7 is formed on the second interlayer dielectric layer 5 by a CVD method. A first dielectric layer 8, which is made of $SiO_2$, is formed on the $SiN_x$ layer 7.

A patterned resist film 9 having openings 9a is then formed on the layer 8, exposing selectively the areas where the lower electrodes 16 are formed. The state at this stage is shown in FIG. 4A.

Figure 4B:
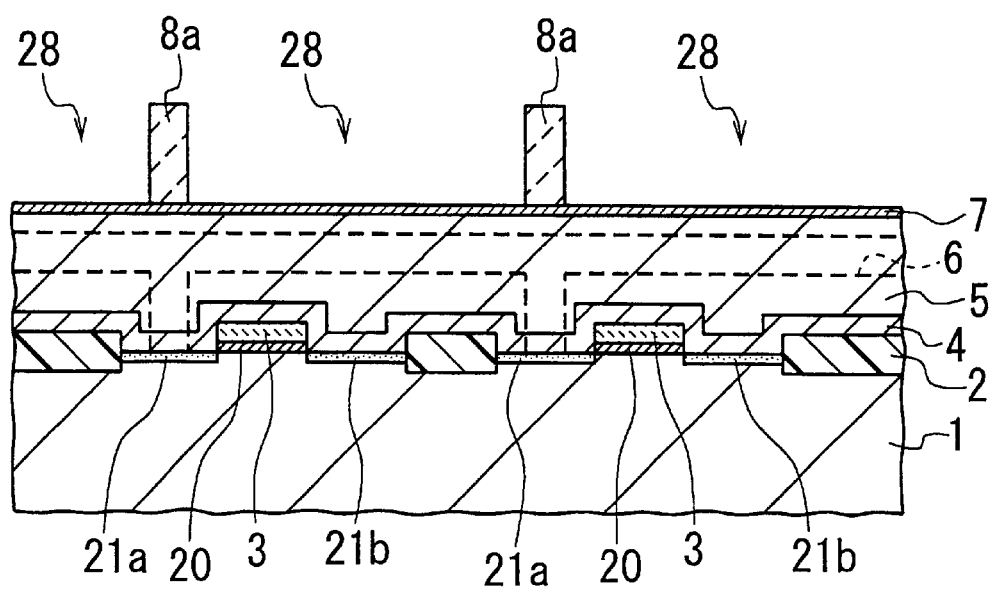

Following this step, using the patterned resist film 9 as a mask, the first dielectric layer 8 made of $SiO_2$ is selectively etched, thereby forming a first spacer layer 8a on the $SiN_x$ layer 7, as shown in FIG. 4B. The first spacer layer 8a, which is made of $SiO_2$, has circular openings 28 at the locations corresponding to the lower electrodes 16. The resist film 9 is then removed. The state at this stage is shown in FIG. 4B.

Figure 4C:
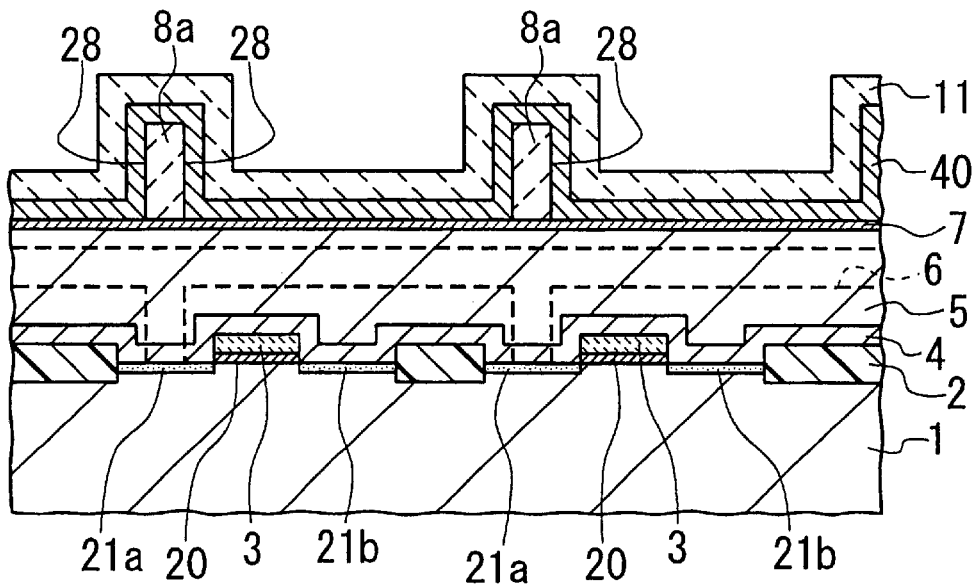

Thereafter, as shown in FIG. 4C, an impurity-doped polysilicon layer is deposited on the $SiN_x$ layer 7 by a CVD method, thereby forming a first conductive layer 40. The layer 40 is contacted with the first spacer layer 8a and the exposed areas of the $SiN_x$ layer 7. For example, the layer 40 has a thickness of 30 nm.

Subsequently, a $SiO_2$ layer is deposited on the first conductive layer 40 by a CVD method, thereby forming a second spacer layer 11, as shown in FIG. 4C. The second spacer layer 11 extends along the first conductive layer 40. For example, the layer 11 has a thickness of 80 nm. The state at this stage is shown in FIG. 4C.

Figure 4D:
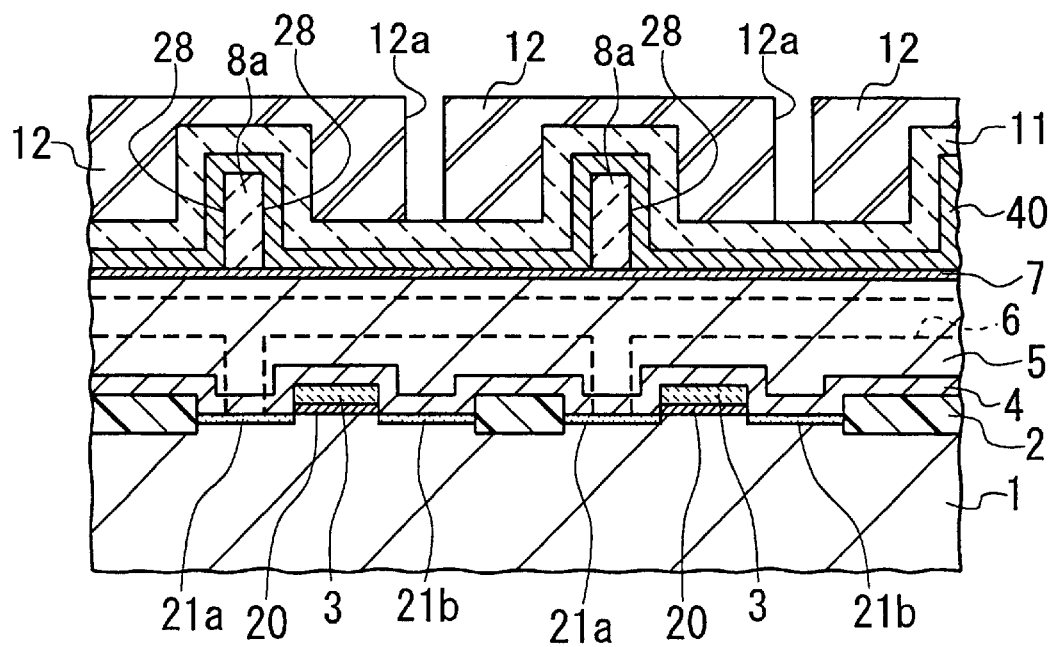

As shown in FIG. 4D, a patterned resist film 12 is then formed on the second spacer layer 11. The film 12 has openings 12a located at the corresponding positions to the respective source/drain regions 21b. The state at this stage is shown in FIG. 4D.

Figure 4E:
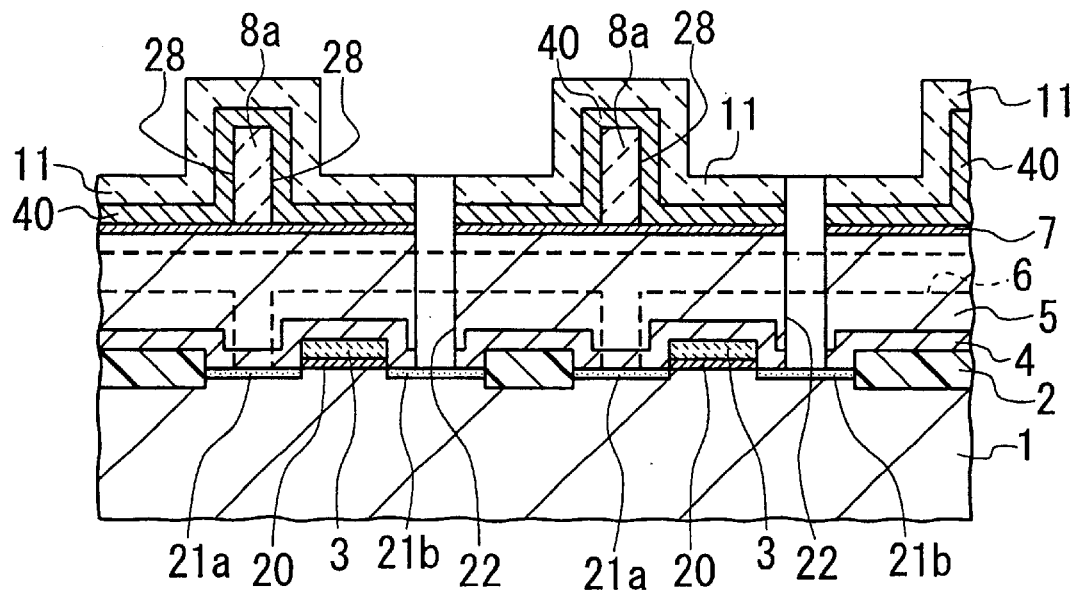

Using the patterned resist film 12 as a mask, the second spacer layer 11, the first conductive layer 40, the $SiN_x$ layer 7, and the second and first interlayer dielectric layers 5 and 4 are etched selectively and successively. Thus, the contact holes 22 are formed to penetrate the layers 11, 40, 7, 5, and 4, exposing the underlying source/drain regions 21b, as shown in FIG. 4E. The resist film 12 is then removed. The state at this stage is shown in FIG. 4E.

Figure 4F:
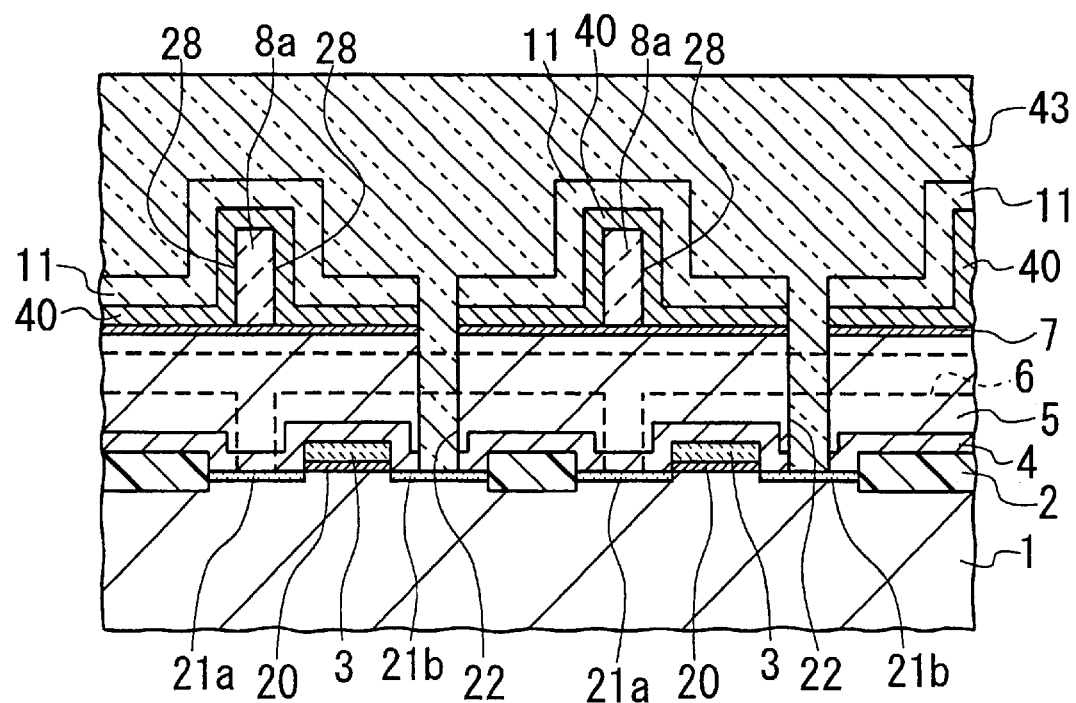

Following this, a thick, impurity-doped polysilicon layer is deposited on the second spacer layer 11 by a CVD method, thereby forming a second conductive layer 43, as shown in FIG. 4F. The layer 43 has a thickness large enough for filling the contact hoes 22 and the inside of the openings 28a. For example, the layer 43 has a thickness of 500 nm. The state at this stage is shown in FIG. 4F.

Figure 4G:
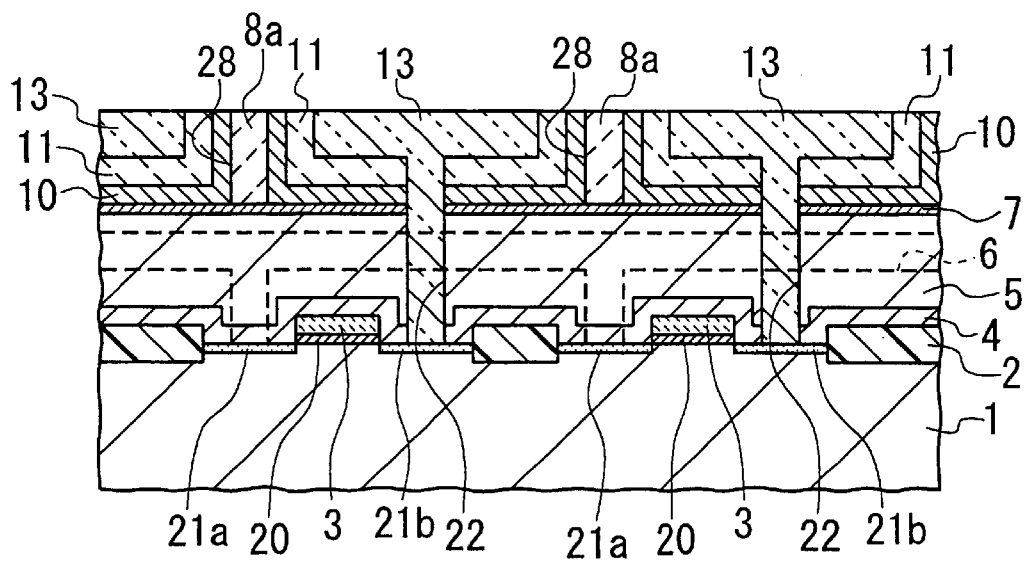

Next, the second conductive layer 43, the second spacer layer 11, and the first conductive layer 40 are successively etched back until the top of the first spacer layer 8a is exposed. Thus, the parts of the layers 40 and 43 existing outside the openings 28 are selectively removed, as shown in FIG. 4G. Thus, the first and second conductive layers 40 and 43 are selectively left only in the openings 28. The first conductive layer 40 left in the openings 28 constitute the first electrode parts 10 of the lower electrodes 16, which are located on the $SiN_x$ layer 7. The second conductive layer 43 left in the openings 28 constitute the second electrode parts 13 of the lower electrodes 16, which are slightly raised from the $SiN_x$ layer 7. The state at this stage is shown in FIG. 4G.

Figure 4H:
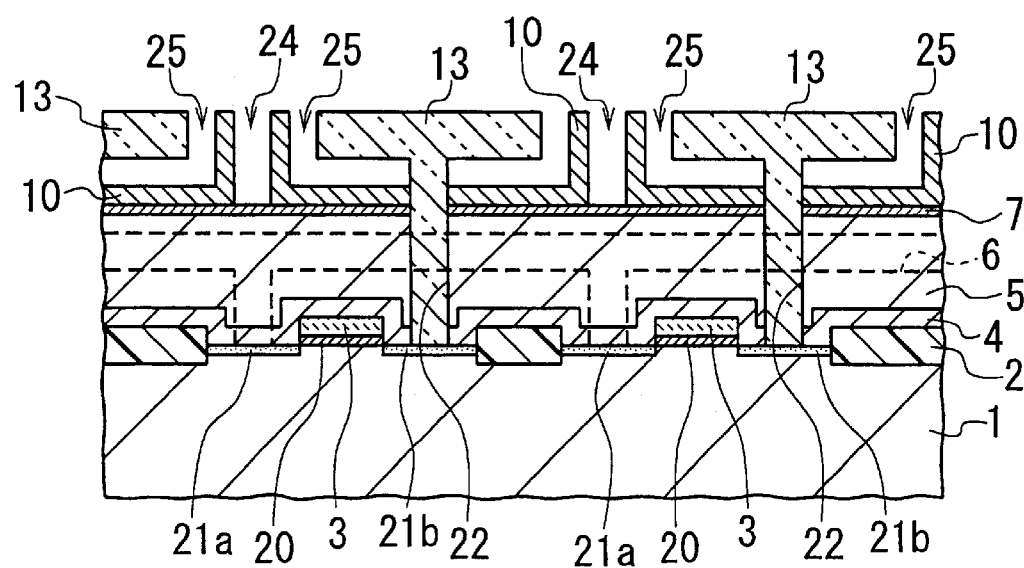
Figure 5:
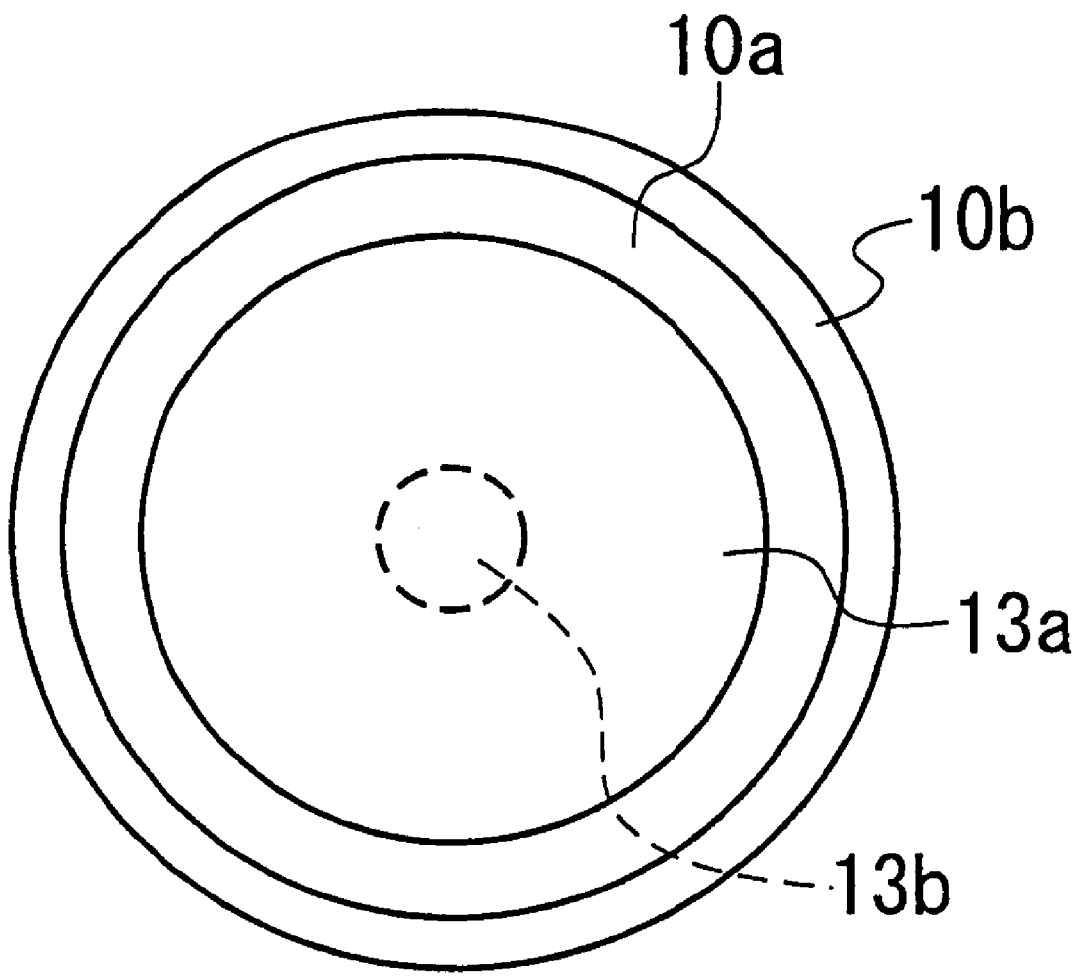
FIG. 5 is a schematic plan view showing the layout of the lower and upper electrodes of the storage capacitor according to the embodiment of FIG. 3.

Using the $SiN_x$ layer 7 as an etch stop layer, the remaining first and second spacer layers 8a and 11 are completely removed. Thus, the gaps 24 are formed between two adjoining ones of the first electrode parts 10 and at the same time, the gaps 25 are respectively formed between the first and second electrode parts 10 and 13, as shown in FIG. 4H. The gaps 24 separate the first electrode parts 10 from each other. The gaps 25 expose the inner faces of the first and second electrode parts 10 and 13. The state at this stage is shown in FIG. 4H.

Furthermore, as shown in FIG. 3, the capacitor dielectric 14 is formed to cover the exposed areas of the first and second electrode subparts 10 and 13 of the lower electrodes 16 and those of the $SiN_x$ layer 7. As the layer 7, for example, a layered structure of a $SiO_2$ layer and a $SiN_x$ layer is used.

Finally, an impurity-doped polysilicon layer, which has a thickness of, for example, 200 nm, is deposited on the capacitor dielectric 14 by a CVD method. The top of the polysilicon layer thus deposited is planarized according to the necessity. Thus, the common upper electrode 15 is formed, as shown in FIG. 3.

Through the above-explained process steps, the semiconductor memory device equipped with the storage capacitors 30 and the MOSFETs 31 in the memory cells are fabricated.

With the storage capacitors 30 according to the embodiment of the present invention, as shown in FIG. 3, the lower electrode 16 is formed by the first and second electrode parts 10 and 13. The first electrode part 10 include the circular-plate-shaped bottom subpart 10a and the cylindrical sidewall subpart 10b extending upward from the periphery of the subpart 10a. The second electrode part 13 is located in the inner space formed by the first electrode part 10. The bottom and sidewall subparts 10a and 10b of the first electrode part 10 are separated from the second electrode part 13 by the gap 25. The capacitor dielectric 14 extends along the opposing surfaces of the first and second electrode parts 10 and 13 of the lower electrode 16 and the upper electrode 15. The upper electrode 15 is formed to fill the gaps 24 and 25.

As a result, the effective surface areas between the lower and upper electrodes 10 and 15 can be increased easily and therefore, a satisfactorily large capacitance value can be realized even if the capacitor 30 is miniaturized. Thus, stable operation of the semiconductor memory device can be ensured, which enhances the operation reliability of the device.

Additionally, with the above-explained method of fabricating the capacitors 30, the gaps 24 and 25 are formed by the use of the first and second spacer layer 8a and 11. Thus, the storage capacitors 30 can be easily fabricated.

As seen from the above explanation, the first electrode part 10 of the lower electrode 16 has an approximately cylindrical shape and the second electrode part 13 has an approximately circular plate shape in the above embodiment. However, it is needles to say that the invention is not limited to these shapes. Each of the first and second electrode part 10 and 13 may have any other shape than those above if it satisfies the limitation defined in the claims.

While the preferred form of the present invention has been described, it is to be understood that modifications will be apparent to those skilled in the art without departing from the spirit of the invention. The scope of the present invention, therefore, is to be determined solely by the following claims.

What is claimed is:

1. A method of fabricating a capacitor, comprising the steps of:
   (a) preparing a substrate having an interlayer dielectric layer;
   (b) forming a first spacer layer over said interlayer dielectric layer;
   said first spacer layer having an opening penetrating the same;
   (c) forming a first conductive layer on said interlayer dielectric layer to cover said first spacer layer;
   (d) forming a second spacer layer on said first conductive layer;
   (e) selectively removing said second spacer layer, said first conductive layer, and said interlayer dielectric layer, thereby forming a contact hole penetrating said second spacer layer, said first conductive layer, and said interlayer dielectric layer;
   (f) forming a second conductive layer on said second spacer layer;
   said second conductive layer being contacted with said first conductive layer;
   (g) selectively removing said second and first conductive layers and said second spacer layer until said first spacer layer is exposed, thereby leaving selectively said second and first conductive layer and said second spacer layer in said opening of said first spacer layer;
   said first conductive layer left in said opening of said first spacer layer serving as a first electrode part of a lower electrode, where first electrode part includes a bottom subpart and a sidewall subpart extending upward from a periphery of said bottom subpart;
   said bottom subpart and said sidewall subpart forming an inner space;
   said second conductive layer left in said opening of said first spacer layer serving as a second electrode part of said lower electrode;
   at least part of said second electrode part being located in said inner space so that a first gap is formed between said bottom subpart and said second electrode part and a second gap is formed between said sidewall subpart and said second electrode part;
   (h) entirely removing said second spacer layer left in said opening of said first spacer layer and said first spacer layer;
   (i) forming a capacitor dielectric on exposed areas of said first electrode part of said lower electrode and said second electrode part thereof; and
   (j) forming an upper electrode on said capacitor dielectric so as to fill said first and second gaps between said first electrode part of said lower electrode and said second electrode part thereof.

2. The method according to claim 1, wherein said second conductive layer left in said opening of said first spacer layer, which serves as said second electrode part of said lower electrode, is contacted with and electrically connected to a wiring layer formed between said interlayer dielectric layer and said substrate or a conductive region formed in said substrate through said contact hole.

3. The method according to claim 1, wherein said bottom subpart of said first electrode part is circular-plate-shaped and said sidewall subpart thereof is cylindrical;
   and wherein said second electrode part is circular-plate-shaped.

4. The method according to claim 1, wherein said step (g) is carried out by an etch back process.

5. The method according to claim 1, further comprising a step of planarizing a surface of said upper electrode after said step (j).

6. The method according to claim 1, wherein said first and second spacer layers are simultaneously removed by an etching process in said step (h).

7. A method of fabricating a semiconductor device with capacitors, comprising the steps of:
   (a) preparing a substrate having an interlayer dielectric layer;
   (b) forming a first spacer layer over said interlayer dielectric layer;
   said first spacer layer having opening penetrating the same.
   (c) forming a first conductive layer on said interlayer dielectric layer to cover said first spacer layer;
   (d) forming a second spacer layer on said fist conductive layer;
   (e) selectively removing said second spacer layer, said first conductive layer, and said interlayer dielectric layer, thereby forming contact holes penetrating said second spacer layer, said first conductive layer, and said interlayer dielectric layer;

(f) forming a second conductive layer on said second spacer layer;
said second conductive layer being contacted with said first conductive layer;

(g) selectively removing said second and first conductive layers and said second spacer layer until said first spacer layer is exposed, thereby leaving selectively said second and first conductive layers and said second spacer layer in said openings of said first spacer layer;
said first conductive layer left in each of said openings of said first spacer layer serving as a first electrode part of a lower electrode of each of said capacitors, where said first electrode part includes a bottom subpart and a sidewall subpart extending upward from a periphery of said bottom subpart;
said bottom subpart and said sidewall subpart forming an inner space;
said second conductive layer left in each of said openings of said first spacer layer serving as a second electrode part of said lower electrode of each of said capacitors;
in each of said openings, at least part of said second electrode part being located in said inner space so that a first gap is formed between said bottom subpart and said second electrode part and a second gap is formed between said sidewall subpart and said second electrode part;

(h) entirely removing said second spacer layer left in said openings of said first spacer layer and said first spacer layer;

(i) forming a capacitor dielectric on exposed areas of said first electrode parts of said lower electrodes and said second electrode parts thereof; and (j) forming an upper electrode on said capacitor dielectric so as to fill said first and second gaps between said first electrode parts of said lower electrodes and said second electrode parts thereof.

8. The method according to claim 7, wherein said second conductive layer left in each of said openings of said first spacer layer, which serves as said second electrode part of said lower electrode, is contacted with and electrically connected to a wiring layer formed between said interlayer dielectric layer and said substrate or a conductive region formed in said substrate through said contact holes.

9. The method according to claim 7, wherein each of said bottom subparts of said first electrode parts is circular-plate-shaped and each of said sidewall subparts thereof is cylindrical;

and wherein each of said second electrode parts is circular-plate-shaped.

10. The method according to claim 7, wherein said step (g) is carried out by an etch back process.

11. The method according to claim 7, further comprising a step of planarizing a surface of said common upper electrode after said step (j).

12. The method according to claim 7, wherein said first and second spacer layers are simultaneously removed by an etching process in said step (h).

* * * * *